(12) United States Patent
Iida (10) Patent No.: US 11,456,108 B2
(45) Date of Patent: Sep. 27, 2022

(54) MULTILAYER BOARD AND MANUFACTURING METHOD THEREOF

(71) Applicant: Murata Manufacturing Co., Ltd., Nagaokakyo (JP)

(72) Inventor: Kanto Iida, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 774 days.

(21) Appl. No.: 16/374,769

(22) Filed: Apr. 4, 2019

(65) Prior Publication Data

US 2019/0228900 A1 Jul. 25, 2019

Related U.S. Application Data

(63) Continuation of application No. PCT/JP2017/034271, filed on Sep. 22, 2017.

(30) Foreign Application Priority Data

Oct. 18, 2016 (JP) .............................. JP2016-204674

(51) Int. Cl.
*H01F 27/28* (2006.01)
*H01F 27/32* (2006.01)
(Continued)

(52) U.S. Cl.
CPC ..... *H01F 27/2804* (2013.01); *H01F 17/0013* (2013.01); *H01F 27/29* (2013.01);
(Continued)

(58) Field of Classification Search
USPC ........................................ 336/200, 192, 198
See application file for complete search history.

(56) References Cited

U.S. PATENT DOCUMENTS

2003/0213615 A1* 11/2003 Utsumi ................ H05K 3/4655
174/257
2009/0256668 A1* 10/2009 Noma ................. H01F 17/0013
336/200

(Continued)

FOREIGN PATENT DOCUMENTS

JP 04-368105 A 12/1992
JP 2003-332707 A 11/2003
(Continued)

OTHER PUBLICATIONS

Official Communication issued in International Patent Application No. PCT/JP2017/034271 dated Dec. 12, 2017.

*Primary Examiner* — Shawki S Ismail
*Assistant Examiner* — Kazi S Hossain
(74) *Attorney, Agent, or Firm* — Keating & Bennett, LLP (57) ABSTRACT

A multilayer board includes a first substrate made of a thermoplastic resin, a first conductor pattern provided on the first substrate, a second substrate made of the thermoplastic resin, and a second conductor pattern provided on the second substrate. An insulation coating which covers the first conductor pattern is partially disposed between the first substrate and the second substrate. The insulation coating is made of a material having lower fluidity at a predetermined press temperature than fluidities of the first substrate and the second substrate, and a plurality of substrates including the first substrate and the second substrate are laminated and thermally compressed and bonded at the press temperature.

9 Claims, 11 Drawing Sheets (51) Int. Cl.

| | | |
|---|---|---|
| *H01F 41/12* | (2006.01) | |
| *H01F 27/29* | (2006.01) | |
| *H01F 41/04* | (2006.01) | |
| *H05K 3/46* | (2006.01) | |
| *H05K 1/16* | (2006.01) | |
| *H01F 17/00* | (2006.01) | |

(52) U.S. Cl.
CPC ......... *H01F 27/323* (2013.01); *H01F 41/041* (2013.01); *H01F 41/042* (2013.01); *H01F 41/122* (2013.01); *H05K 1/16* (2013.01); *H05K 3/46* (2013.01); *H01F 2027/2809* (2013.01)

(56) References Cited

U.S. PATENT DOCUMENTS

| | | | | |
|---|---|---|---|---|
| 2014/0333407 | A1* | 11/2014 | Otsubo | H01F 27/2804 336/200 |
| 2015/0109088 | A1* | 4/2015 | Kim | H01F 17/0013 336/200 |
| 2016/0027578 | A1* | 1/2016 | Nishino | H05K 3/4617 335/297 |
| 2016/0087619 | A1* | 3/2016 | Lee | H03K 5/2418 327/79 |

FOREIGN PATENT DOCUMENTS

| | | |
|---|---|---|
| JP | 2006-310716 A | 11/2006 |
| JP | 2008-166390 A | 7/2008 |
| JP | 2015-082660 A | 4/2015 |
| WO | 2015/079941 A1 | 6/2015 |

\* cited by examiner

MULTILAYER BOARD AND MANUFACTURING METHOD THEREOF

CROSS REFERENCE TO RELATED APPLICATIONS

This application claims the benefit of priority to Japanese Patent Application No. 2016-204674 filed on Oct. 18, 2016 and is a Continuation Application of PCT Application No. PCT/JP2017/034271 filed on Sep. 22, 2017. The entire contents of each of these applications are hereby incorporated herein by reference.

BACKGROUND OF THE INVENTION

1. Field of the Invention

The present invention relates to a multilayer board that includes substrates made of a thermoplastic resin and that are laminated, and a manufacturing method thereof.

2. Description of the Related Art

A multilayer board which is formed by laminating a plurality of resin substrates with predetermined conductor patterns formed thereon is used for a coil device or an inductor, for example. JP H4-368105 A discloses a planar inductor formed in such a multilayer board. According to JP H4-368105 A, copper foil is applied to a polyimide film, and this copper foil is etched to form a conductor pattern, and these substrates are laminated and thermally compressed and bonded to form the multilayer board.

As a method for manufacturing a multilayer board, a collective lamination method using thermoplastic resin substrates is easy in terms of a manufacturing process.

In the above process, the thermoplastic resin substrate flows during heating and molding, and a conductor pattern formed on this thermoplastic resin substrate also flows together. Thus, when the conductor pattern is inclined or displaced, the conductor patterns close to each other may cause short-circuiting.

On the other hand, when an interval between the conductor patterns close to each other is widened in advance to avoid short-circuiting between the conductor patterns, an element size becomes large.

SUMMARY OF THE INVENTION

Preferred embodiments of the present invention provide multilayer boards that each prevent short-circuiting between conductor patterns while increasing the density of the conductor patterns to prevent an increase in a size of an element, and also provide manufacturing methods thereof.

A multilayer board according to a preferred embodiment of the present invention includes a first substrate made of a thermoplastic resin; a first conductor pattern provided on an upper surface of the first substrate; a second substrate made of a thermoplastic resin; a second conductor pattern provided on an upper surface of the second substrate; and an insulation coating which is made of a material having lower fluidity at a predetermined press temperature than those of the first substrate and the second substrate, and is partially disposed between the first substrate and the second substrate to cover the first conductor pattern, in which the second substrate is in contact with the upper surface of the first substrate, and the first conductor pattern and the second conductor pattern are conductors that are closest to each other in a lamination direction, and a plurality of substrates including the first substrate and the second substrate are laminated and thermally compressed and bonded at the press temperature.

According to the above configuration, even when the first substrate and the second substrate soften and flow at the press temperature, the insulation coating hardly softens and hardly flows, so that a stable insulation property is maintained. Furthermore, the insulation coating is partially disposed between the first substrate and the second substrate, so that adhesion between the first substrate and the second substrate is not significantly reduced or prevented. Furthermore, the insulation coating covers the first conductor pattern, such that a resin which readily flows is not interposed between the insulation coating and the first conductor pattern, so that the first conductor pattern is effectively protected by the insulation coating.

The first conductor pattern and the second conductor pattern may be located at positions shifted from each other in a plan view. In this structure, although the first conductor pattern and the second conductor pattern are easily inclined and displaced with a resin flow, the insulation property is maintained even in this case.

The first conductor pattern and the second conductor pattern may partially overlap each other in a plan view. Consequently, the first conductor pattern and the second conductor pattern are able to be highly densely disposed in the laminated body, and the multilayer board is able to be miniaturized. Furthermore, although in this structure, the first conductor pattern and the second conductor pattern are inclined and displaced with a resin flow, and therefore the first conductor pattern and the second conductor pattern are close to each other, the insulation property is maintained even in this case.

The first conductor pattern and the second conductor pattern are preferably patterns of copper foil. This structure reduces conductor loss of the conductor patterns, and the conductor patterns and the insulation coating are able to be easily formed.

The insulation coating is preferably an oxide film provided on a surface of the copper foil. This structure makes it unnecessary to newly coat and form a film of a material different from the conductor patterns on the conductor patterns, and makes it easy to form the insulation coating. Furthermore, it is easy to form the thin insulation coating.

The insulation coating is preferably a thermosetting resin film which is thermally cured at a temperature lower than the press temperature. With this configuration, particularly, the insulation coating is able to be formed by applying the thermosetting resin film to the first substrate or the second substrate, and consequently the insulation coating is able to be easily formed. Furthermore, the thermosetting resin continuously covers the conductor patterns adjacent along the substrate, so that a relative positional relationship between the first conductor pattern and the second conductor pattern is able to be easily maintained with the thermosetting film.

The first conductor pattern and the second conductor pattern are coil patterns including a winding axis along the lamination direction, for example. According to this configuration, when a coil device having a larger coil turn is obtained while being miniaturized or when an inductor having a high inductance per unit volume is obtained, short-circuiting is prevented even when the first conductor pattern and the second conductor pattern are highly densely provided.

A method for manufacturing a multilayer board according to a preferred embodiment of the present invention includes a pattern forming step of forming a first conductor pattern on an upper surface of a first substrate made of a thermoplastic resin, and forming a second conductor pattern on an upper surface of a second substrate made of a thermoplastic resin; an insulation coating forming step of forming an insulation coating by partially disposing a material between the first substrate and the second substrate such that the material is at least partially in contact with the first conductor pattern, the material having lower fluidity at a predetermined press temperature than those of the first substrate and the second substrate; and a laminated body forming step of laminating a plurality of substrates including the first substrate and the second substrate, thermally compressing and bonding the plurality of substrates at the press temperature and integrally forming the plurality of substrates in a state in which the second substrate is in contact with the upper surface of the first substrate and the first conductor pattern and the second conductor pattern are closest to each other in a lamination direction.

According to the above method, even when the first substrate and the second substrate soften and flow at the press temperature, the insulation coating hardly softens and hardly flows, so that a stable insulation property is maintained. Furthermore, the insulation coating is partially disposed between the first substrate and the second substrate, so that adhesion between the first substrate and the second substrate is not significantly reduced or prevented. Furthermore, the insulation coating covers the first conductor pattern, such that a resin which readily flows is not interposed between the insulation coating and the first conductor pattern, so that the first conductor pattern is effectively protected by the insulation coating.

Preferably, in the pattern forming step, the first conductor pattern is formed by patterning copper foil, and, in the insulation coating forming step, an oxide film is formed on the first conductor pattern by oxygen plasma processing to form the insulation coating. Consequently, it is easy to form the insulation coating as compared to a case in which the film of a material different from the conductor patterns is applied onto the conductor patterns. Furthermore, it is easy to form the thin insulation coating.

Furthermore, preferably, in the pattern forming step, a via conductor formed by a conductive paste including a reducing agent is formed in the second substrate, and, in the laminated body forming step, the insulation coating is etched and removed by the reducing agent included in the conductive paste of the via conductor, and the via conductor provides inter-layer connection between the first conductor pattern and the second conductor pattern.

According to the above manufacturing method, it is unnecessary to perform a separate step which prevents formation of the oxide film at a portion at which an inter-layer connection is provided, or a separate step for removing the insulation coating at the portion at which the inter-layer connection is provided by patterning during formation of the oxide film, so that it is easy to perform manufacturing.

In the insulation coating forming step, a thermosetting resin film which is thermally cured at a temperature lower than the press temperature is preferably formed on the first substrate to form the insulation coating. With this method, particularly, the insulation coating is able to be formed by applying the thermosetting resin film to the first substrate or the second substrate, and consequently, the insulation coating is easily formed.

In the insulation coating forming step, a thermosetting resin film which is thermally cured at a temperature lower than the press temperature is preferably formed on a surface of one of the plurality of substrates facing the first substrate to form the insulation coating. With this method, the insulation coating is also able to be formed by applying the thermosetting resin film to the first substrate or the second substrate, and consequently the insulation coating is easily formed.

Preferred embodiments of the present invention provide multilayer boards each of which reduce or prevent short-circuiting between conductor patterns while increasing a density of the conductor patterns and preventing an increase in a size of an element.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with some specific examples shown with reference to the drawings. The same or similar portions will be assigned the same reference numerals in each of the drawings. The preferred embodiments will be separately described for the sake of convenience and to facilitate description of the main points or understanding. However, configurations described in the different preferred embodiments may be partially replaced or combined. In second and subsequent preferred embodiments, matters common to those in the first preferred embodiment are omitted and only differences will be described. In particular, the same or similar functions and advantageous effects provided by the same configuration will not be successively described in each preferred embodiment.

First Preferred Embodiment

Figure 1:
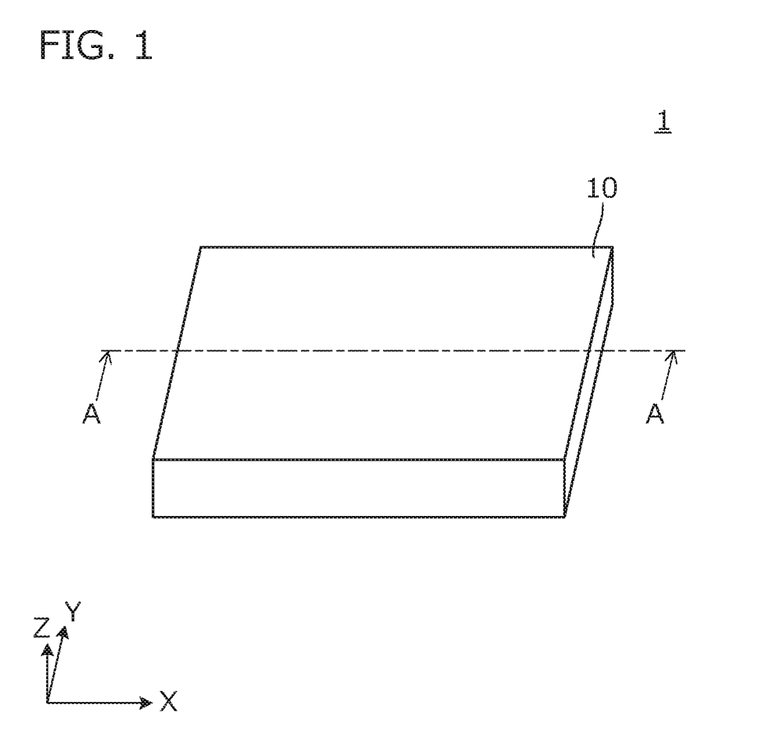
FIG. 1 is a perspective view of a multilayer board 1 according to a first preferred embodiment of the present invention.
Figure 2A:
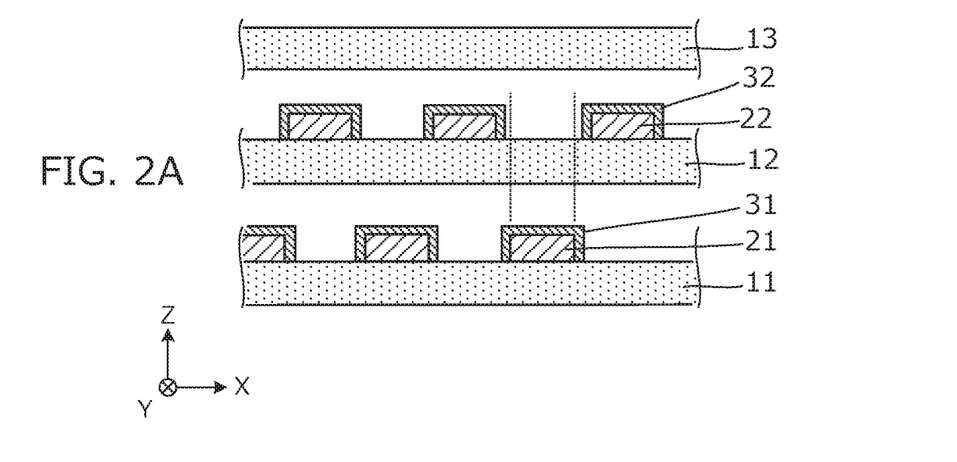
FIGS. 2A and 2B are partial cross-sectional views illustrating an internal configuration of the multilayer board 1.
Figure 2B:
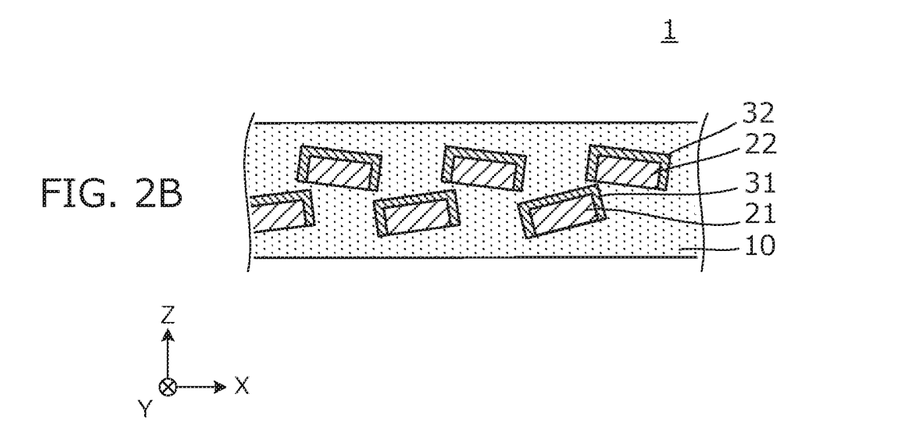

FIG. 1 is a perspective view of a multilayer board 1 according to a first preferred embodiment of the present invention. FIGS. 2A and 2B are partial cross-sectional views illustrating an internal configuration of the multilayer board 1. FIG. 2A is the cross-sectional view at a stage before a plurality of substrates are laminated and pressed. FIG. 2B is a cross-sectional view after lamination and pressing, and is the cross-sectional view of an A-A portion in FIG. 1.

A multilayer board 1 preferably has a rectangular or substantially rectangular parallelepiped shape, for example. In the multilayer board 1, a first substrate 11 as a lowermost layer, a second substrate 12, and a third substrate 13 are laminated in this order. The first substrate 11, the second substrate 12, and the third substrate 13 are preferably made of a thermoplastic resin, for example. Note that the present preferred embodiment describes a smaller number of laminated substrates taking into account clarity of the drawings and ease of description.

In a direction illustrated in FIG. 2A, a first conductor pattern 21 is provided on an upper surface of the first substrate 11, and a second conductor pattern 22 is provided on an upper surface of the second substrate 12. Furthermore, an insulation coating 31 is provided on the surface of the first conductor pattern 21. Similarly, an insulation coating 32 is provided on the surface of the second conductor pattern 22.

Thus, the multilayer board 1 according to the present preferred embodiment includes the first conductor pattern 21, the first substrate 11 on which the first conductor pattern 21 is provided and which is made of the thermoplastic resin, the second conductor pattern 22, the second substrate 12 on which the second conductor pattern 22 is provided and which is made of the thermoplastic resin, and the insulation coating 31 which is partially disposed between the first substrate 11 and the second substrate 12 and covers the first conductor pattern 21.

Each of the substrates 11, 12 and 13 is preferably, for example, a thermoplastic resin, such as liquid crystal polymer (LPC). Each of the conductor patterns 21 and 22 is made by patterning copper foil, and the insulation coatings 31 and 32 are preferably, for example, copper oxide films provided on the surface of the copper foil and having an electrical insulation property in the present preferred embodiment.

As illustrated in FIG. 2A, the first conductor pattern and the second conductor pattern 22 have a positional relationship shifted from each other in a plan view in a lamination direction. In the present preferred embodiment, in particular, the first conductor pattern 21 and the second conductor pattern 22 are shifted by a half pitch and disposed such that one conductor pattern overlaps between lines of the other conductor pattern. That is, the first conductor pattern 21 and the second conductor pattern 22 are close to each other in an X direction.

The substrates 11, 12, and 13 are laminated, and heated and pressed in a state illustrated in FIG. 2A to form a laminated body 10 in which the first conductor pattern 21 and the second conductor pattern 22 are buried in the thermoplastic resin as illustrated in FIG. 2B. During this heating and pressing, the resin of each of the substrates 11, 12, and 13 flows, so that each of the conductor patterns 21 and 22 also flows, and is inclined or displaced. As a result, the first conductor pattern 21 and the second conductor pattern 22 become closer to each other in some cases. However, at a press temperature during the heating and pressing, the copper oxide films do not flow. Thus, the insulation coating 31 covers the surface of the first conductor pattern 21 even when the first conductor pattern 21 flows, so that the first conductor pattern 21 and the second conductor pattern 22 do not short-circuit, even when the first conductor pattern 21 and the second conductor pattern 22 contact each other.

When the first conductor pattern 21 and the second conductor pattern 22 are located at positions shifted from each other in the plan view as in the present preferred embodiment, the first conductor pattern 21 and the second conductor pattern 22 are easily inclined or displaced due to a resin flow. However, even in this case, short-circuiting is prevented as described above.

There is no other conductor pattern in the upper layer of the second conductor pattern 22, so that the insulation coating 32 may not be provided on the second conductor pattern 22.

Second Preferred Embodiment

Figure 3A:
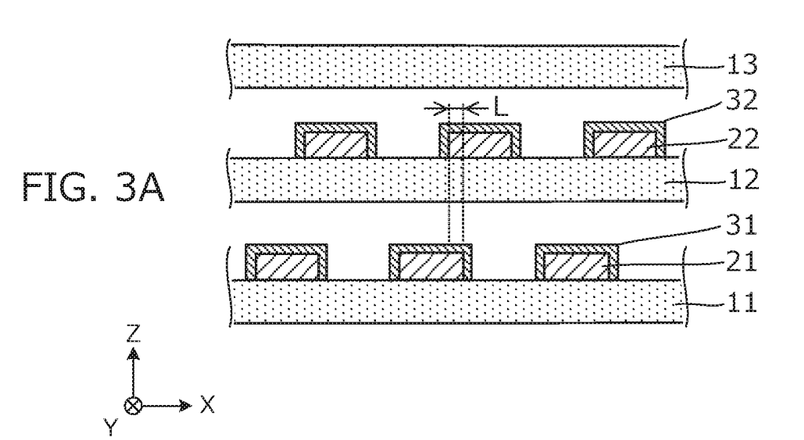
FIGS. 3A and 3B are partial cross-sectional views of a multilayer board 2 according to a second preferred embodiment of the present invention.
Figure 3B:
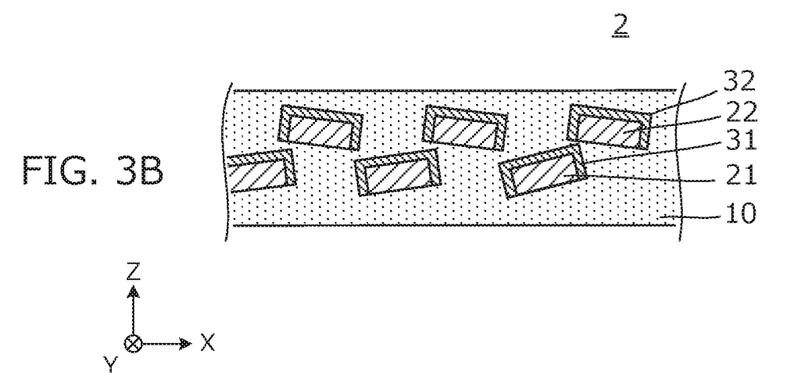

FIGS. 3A and 3B are partial cross-sectional views of a multilayer board 2 according to a second preferred embodiment of the present invention. FIG. 3A is the cross-sectional view at a stage before a plurality of substrates are laminated and pressed. FIG. 3B is the cross-sectional view after lamination and pressing. These figures are the cross-sectional views of positions corresponding to respective positions in FIGS. 2A and 2B described in the first preferred embodiment.

In the multilayer board 2, a first substrate 11 as a lowermost layer, a second substrate 12, and a third substrate 13 are laminated in this order. The first substrate 11, the second substrate 12, and the third substrate 13 are preferably made of, for example, a thermoplastic resin.

In a direction illustrated in FIG. 3A, first conductor pattern 21 is provided on an upper surface of the first substrate 11, and second conductor pattern 22 is provided on an upper surface of the second substrate 12. Furthermore, an insulation coating 31 is provided on the surface of the first conductor pattern 21. Similarly, an insulation coating 32 is provided on the surface of the second conductor pattern 22. A positional relationship between the first conductor pattern and the second conductor pattern differs from that in the example illustrated in FIGS. 2A and 2B. The remaining configuration is as described in the first preferred embodiment.

As illustrated in FIG. 3A, the first conductor pattern and the second conductor pattern 22 have a positional relationship shifted from each other in a plan view in a lamination direction. In the present preferred embodiment, one side of the first conductor pattern 21 and one side of the second conductor pattern 22 in the line width direction of the conductor patterns partially overlap in the plan view. A distance L in FIG. 3A represents the amount of the overlap.

When the first conductor pattern 21 and the second conductor pattern 22 partially overlap in the plan view as in the present preferred embodiment, the first conductor pattern 21 and the second conductor pattern 22 are able to be highly densely disposed in a laminated body, so that it is possible to reduce the size of the multilayer board. Furthermore, with this structure, as a resin flows, the first conductor pattern 21 and the second conductor pattern 22 are inclined or displaced, and then the first conductor pattern 21 and the second conductor pattern 22 become closer to each other. However, even in this case, the above insulation property is maintained.

Third Preferred Embodiment

Figure 4A:
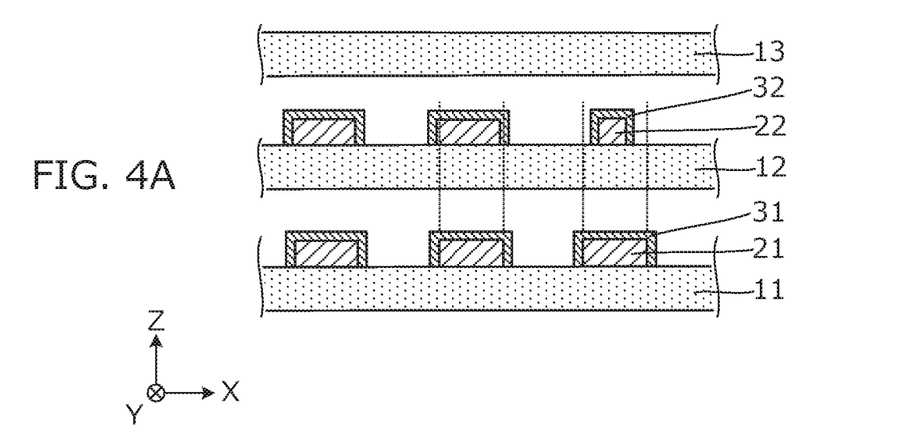
FIGS. 4A and 4B are partial cross-sectional views of a multilayer board 3 according to a third preferred embodiment of the present invention.
Figure 4B:
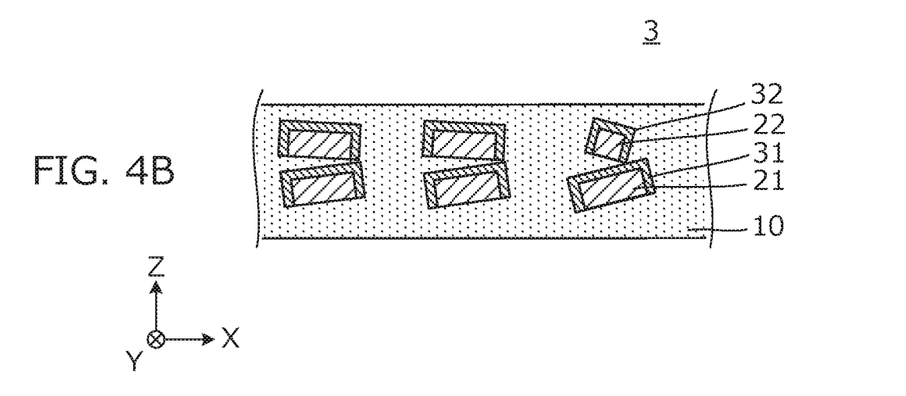

FIGS. 4A and 4B are partial cross-sectional views of a multilayer board 3 according to a third preferred embodiment of the present invention. FIG. 4A is the cross-sectional view at a stage before a plurality of substrates are laminated and pressed. FIG. 4B is the cross-sectional view after lamination and pressing. These figures are the cross-sectional views of positions corresponding to respective positions in FIGS. 2A and 2B described in the first preferred embodiment.

A positional relationship between first conductor pattern 21 and second conductor pattern 22 differs from that in the example illustrated in FIGS. 2A and 2B. Furthermore, a size relationship between the first conductor pattern 21 and the second conductor pattern 22 differs. The remaining configuration is as described in the first preferred embodiment.

As illustrated in FIG. 4A, the first conductor pattern and the second conductor pattern 22 have a positional relationship in which the first conductor pattern 21 and the second conductor pattern 22 overlap in a plan view in a lamination direction. In the present preferred embodiment, the entire or substantially the entire second conductor pattern 22 overlaps the first conductor pattern 21 in the plan view. When the first conductor pattern 21 and the second conductor pattern 22 entirely or substantially entirely overlap in the plan view, the conductor patterns are only slightly inclined or displaced due to a resin flow during heating and pressing. In this regard, when the cross-sectional shape of the one conductor pattern (the second conductor pattern 22 in this example) is a square shape (an aspect ratio is approximately 1:1), and the cross-sectional shape of the other conductor pattern (the first conductor pattern 21 in this example) is a rectangular shape (for example, the aspect ratio is approximately 1:2), the conductor pattern with the square cross-sectional shape is easily inclined with a resin flow. However, according to the present preferred embodiment, the insulation property between the first conductor pattern 21 and the second conductor pattern 22 is maintained even in this structure.

Fourth Preferred Embodiment

Figure 5A:
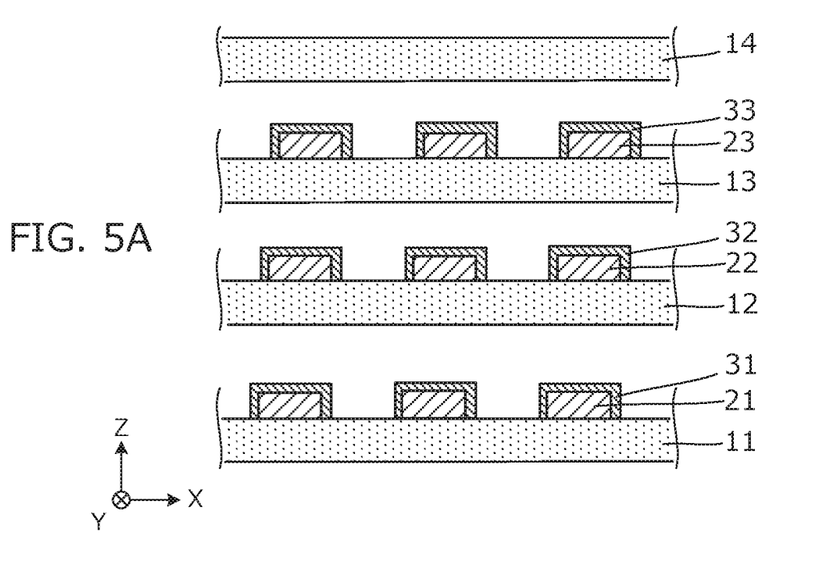
FIGS. 5A and 5B are partial cross-sectional views of a multilayer board 4 according to a fourth preferred embodiment of the present invention.
Figure 5B:
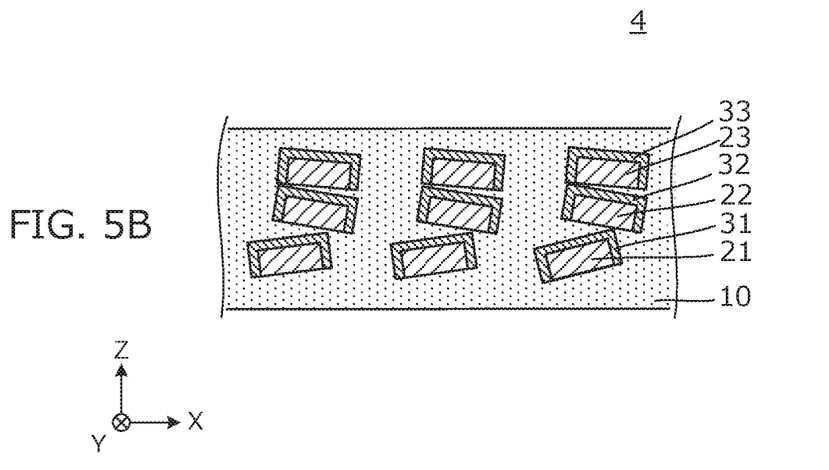

FIGS. 5A and 5B are partial cross-sectional views of a multilayer board 4 according to a fourth preferred embodiment of the present invention. FIG. 5A is the cross-sectional view at a stage before a plurality of substrates are laminated and pressed. FIG. 5B is a cross-sectional view after lamination and pressing. These figures are the cross-sectional views of positions corresponding to respective positions in FIGS. 2A and 2B described in the first preferred embodiment. The present preferred embodiment will describe an example of the multilayer board including three or more layers (preferably three layers, for example, in the example in FIGS. 5A and 5B) of conductor patterns.

The multilayer board 4 preferably has a rectangular or substantially rectangular parallelepiped shape, for example. In the multilayer board 4, a first substrate 11 as a lowermost layer, a second substrate 12, a third substrate 13, and a fourth substrate 14 are laminated in this order. Each of the substrates 11, 12, 13, and 14 is preferably made of, for example, a thermoplastic resin.

In a direction illustrated in FIG. 5A, a first conductor pattern 21 is provided on an upper surface of the first substrate 11, a second conductor pattern 22 is provided on an upper surface of the second substrate 12, and a third conductor pattern 23 is provided on an upper surface of the third substrate 13. Furthermore, an insulation coating 31 is provided on the surface of the first conductor pattern 21, an insulation coating 32 is provided on the surface of the second conductor pattern 22, and an insulation coating 33 is provided on the surface of the third conductor pattern 23.

The first conductor pattern 21, the second conductor pattern 22, and the third conductor pattern 23 substantially overlap in the plan view. However, stacking misalignment accuracy causes these conductor patterns to vary in a line width direction (X direction) to some degree in some cases. The remaining configuration is as described in the first preferred embodiment.

When the conductor pattern in each layer entirely or substantially entirely overlaps in a plan view in a lamination direction as in the present preferred embodiment, a pressure to be applied to each conductor pattern during heating and pressing is likely to be uniform or substantially uniform. However, due to the stacking misalignment accuracy of the substrates, when each conductor pattern is shifted even slightly in the line width direction, a balance of a resin flow becomes unbalanced and non-uniform, and each conductor pattern is likely to be inclined in the line width direction. However, according to the present preferred embodiment, the insulation property between the first conductor pattern 21 and the second conductor pattern 22 is maintained even in this structure.

When three or more layers of the conductor patterns are provided as in the present preferred embodiment, one of the two conductor patterns adjacent in the lamination direction among these conductor patterns is the "first conductor pattern", and the other one is the "second conductor pattern". For example, in FIG. 5A, it is also possible to consider the conductor pattern 22 as the "first conductor pattern" and the conductor patterns 23 as the "second conductor pattern".

Fifth Preferred Embodiment

A fifth preferred embodiment of the present invention will describe an example of a multilayer board which is used as a coil device or an inductor element.

Figure 6:
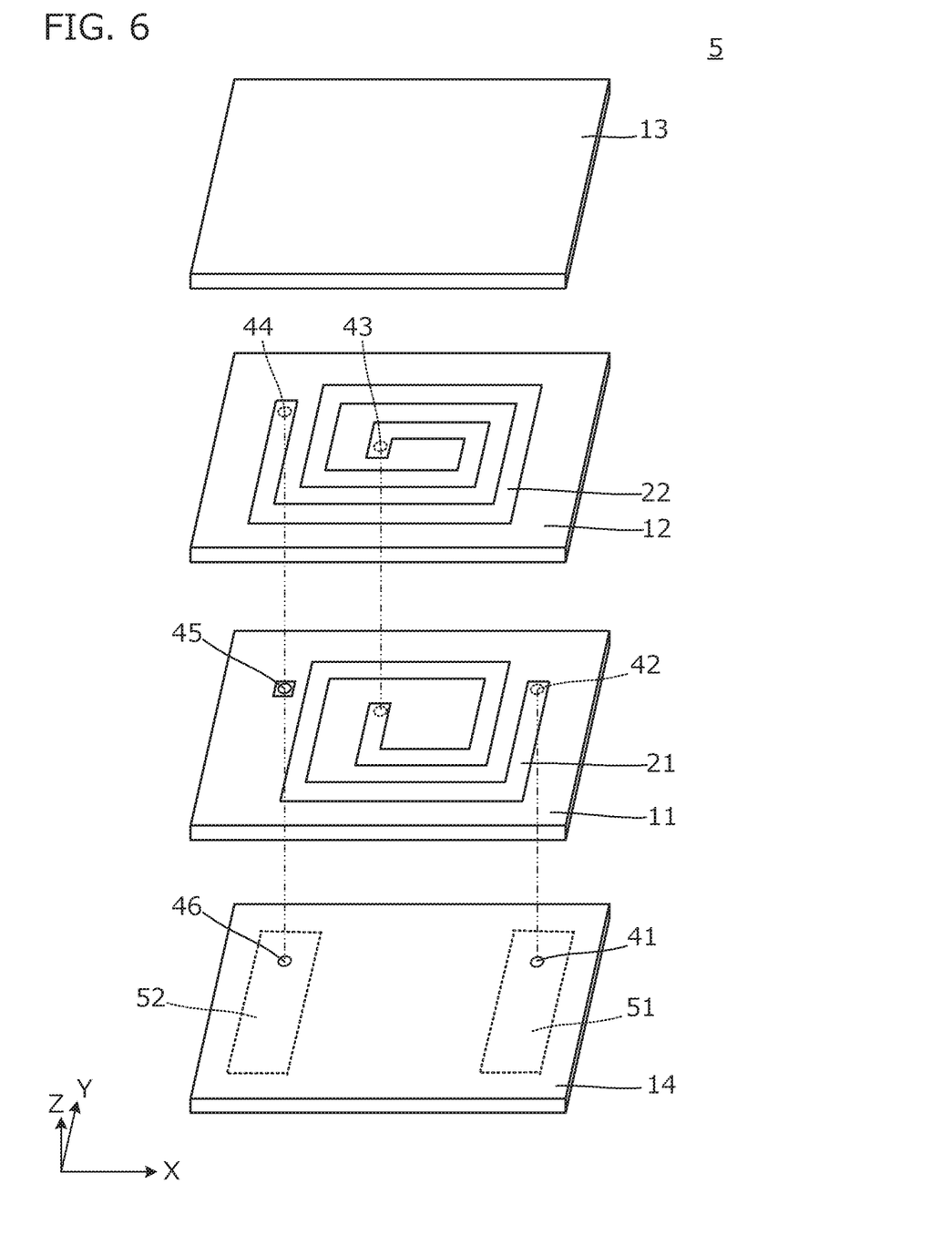
FIG. 6 is an exploded perspective view of a multilayer board 5 according to a fifth preferred embodiment of the present invention.

FIG. 6 is an exploded perspective view of a multilayer board 5. In the multilayer board 5, a fourth substrate 14 as a lowermost layer, a first substrate 11, a second substrate 12, and a third substrate 13 are laminated in this order. Each of the substrates 11, 12, 13, and 14 is preferably made of, for example, a thermoplastic resin.

In a direction illustrated in FIG. 6, a first conductor pattern 21 is provided on an upper surface of the first substrate 11, and a second conductor pattern 22 is provided on an upper surface of the second substrate 12. Both of the first conductor pattern 21 and the second conductor pattern 22 are preferably rectangular or substantially rectangular spiral conductor patterns, for example. An insulation coating (a reference numeral is not illustrated) is provided on the surface of the first conductor pattern 21. Similarly, an insulation coating (a reference numeral is not illustrated) is provided on the surface of the second conductor pattern 22.

Terminal electrodes 51 and 52 are provided on a lower surface of the fourth substrate 14. The terminal electrode 51 and an outer end terminal of the first conductor pattern 21 are connected by via conductors 41 and 42, and an inner end terminal of the first conductor pattern 21 and an inner end terminal of the second conductor pattern 22 are connected by a via conductor 43. Furthermore, an outer end terminal of the second conductor pattern 22 and the terminal electrode 52 are connected by via conductors 44, 45 and 46.

Each of the substrates 11, 12, 13, and 14 is preferably, for example, a thermoplastic resin, such as liquid crystal polymer (LCP). Each of the conductor patterns 21 and 22 is made by patterning copper foil, and the insulation coatings are preferably, for example, copper oxide films provided on the surface of the copper foil and having an electrical insulation property in the present preferred embodiment. Each of the via conductors 41, 42, 43, 44, 45, and 46 is preferably formed by printing and coating, for example, an Sn-based conductive paste in holes provided in the substrates, melting the Sn-based conductive paste by heat during heating and pressing, and solidifying the Sn-based conductive paste.

The first conductor pattern 21 and the second conductor pattern 22 overlap in the plan view. The degree of overlap differs depending on positions of both of the conductor patterns 21 and 22, and preferably has a relationship illustrated in FIG. 2A, 2B, 3A, 3B, 4A or 4B. Consequently, the insulation property between the first conductor pattern 21 and the second conductor pattern 22 is maintained even in this structure.

Sixth Preferred Embodiment

Figure 7:
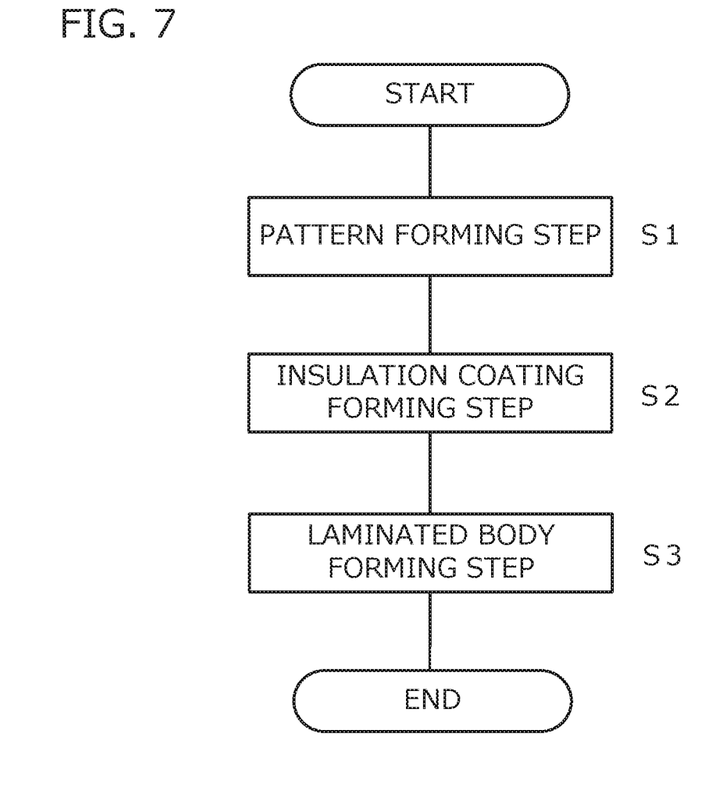
FIG. 7 is a flowchart illustrating a manufacturing process of a multilayer board according to a sixth preferred embodiment of the present invention.
Figure 8A:
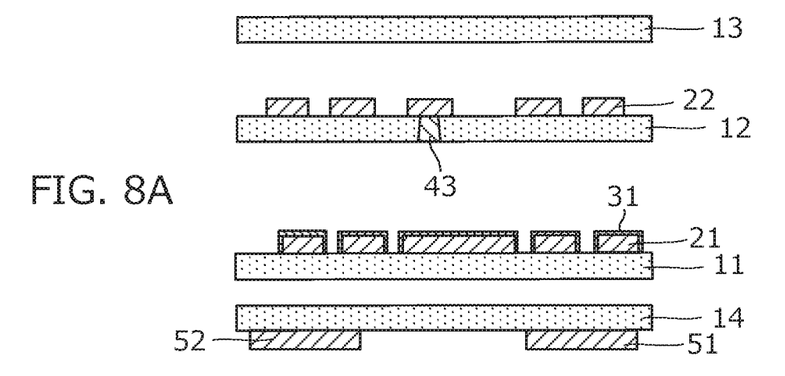
FIG. 8A is a cross-sectional view at a stage before a plurality of substrates of a multilayer board 6 according to the sixth preferred embodiment of the present invention are laminated and pressed.
Figure 8B:
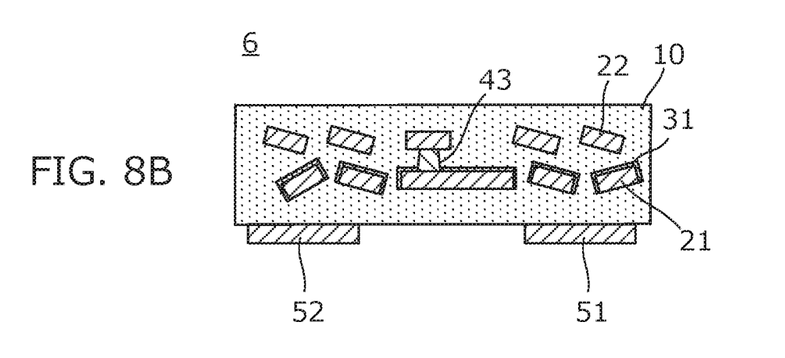
FIG. 8B is a cross-sectional view after lamination and pressing.

A sixth preferred embodiment of the present invention will describe a non-limiting example of a method for manufacturing a multilayer board. FIG. 7 is a flowchart illustrating a manufacturing process of a multilayer board according to the present preferred embodiment. Furthermore, FIG. 8A is a cross-sectional view at a stage before a plurality of substrates of a multilayer board 6 according to the present preferred embodiment are laminated and pressed. FIG. 8B is a cross-sectional view after lamination and pressing.

First, in a pattern forming step S1 illustrated in FIG. 7, as illustrated in FIG. 8A, a first conductor pattern 21 is formed on a first substrate 11 preferably made of, for example, a thermoplastic resin, a second conductor pattern 22 is formed on a second substrate 12, and terminal electrodes 51 and 52 are formed on a fourth substrate 14. For example, copper foil is preferably applied to an LCP sheet, and this copper foil is patterned by photolithography. Furthermore, a hole is formed in the second substrate 12, and, for example, an Sn-based conductive paste including a reducing agent is preferably printed and coated in this hole and is temporarily cured to form a via conductor 43 which is not yet solidified. The reducing agent is preferably, for example, an alcohol or aldehyde reducing agent.

In an insulation coating forming step S2, an insulation coating 31 which is preferably, for example, an oxide film is formed on the surface of the first conductor pattern 21 by, for example, oxygen plasma processing.

In a laminated body forming step S3, the substrates 11, 12, 13, and 14 are laminated, and heated and pressed. The oxide film at a portion of the insulation coating 31 of the first conductor pattern 21 with which the via conductor 43 is in contact is reduced or removed by the reducing agent included in the conductive paste, and the second conductor pattern is electrically connected to a base of the first conductor pattern 21 via the via conductor 43.

According to the above-described steps, the multilayer board 6 illustrated in FIG. 8B is able to be obtained.

Seventh Preferred Embodiment

A seventh preferred embodiment of the present invention will describe a multilayer board that includes insulation coating other than an oxide film, and a non-limiting example of a manufacturing method thereof.

Figure 9A:
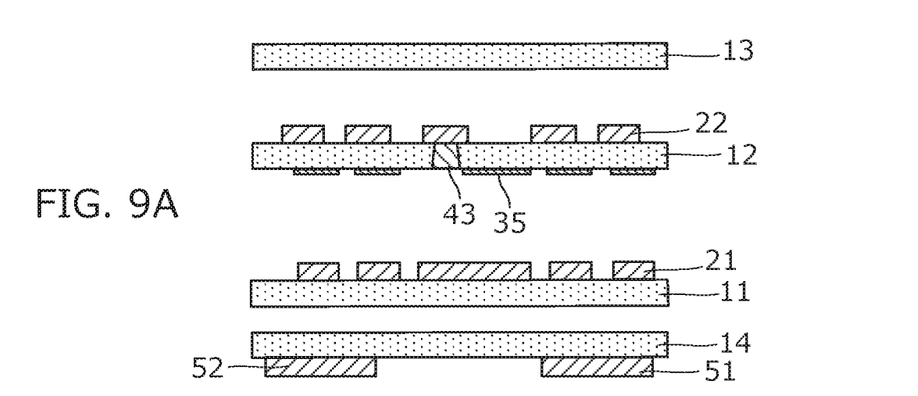
FIG. 9A is a cross-sectional view at a stage before a plurality of substrates of a multilayer board 7 according to a seventh preferred embodiment of the present invention are laminated and pressed.
Figure 9B:
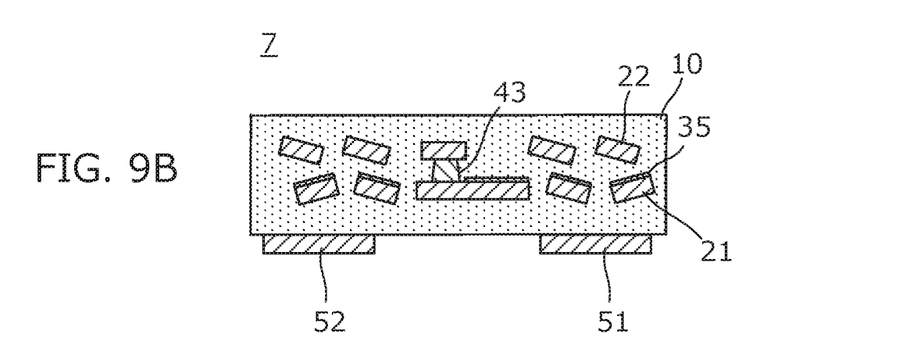
FIG. 9B is a cross-sectional view after lamination and pressing.

FIG. 9A is a cross-sectional view at a stage before a plurality of substrates of a multilayer board 7 according to the present preferred embodiment are laminated and pressed. FIG. 9B is a cross-sectional view after lamination and pressing. These figures are the cross-sectional views at positions corresponding to respective positions in FIGS. 8A and 8B described in the sixth preferred embodiment.

The positional relationship between the first conductor pattern 21 and the second conductor pattern 22 differs from that in the example illustrated in FIGS. 8A and 8B. Furthermore, a size relationship between the first conductor pattern 21 and the second conductor pattern 22 differs. The remaining configuration is as described in the first preferred embodiment.

First, as illustrated in FIG. 9A, the first conductor pattern 21 is provided on a first substrate 11 preferably made of, for example, a thermoplastic resin, the second conductor pattern 22 is provided on the second substrate 12, and terminal electrodes 51 and 52 are provided on a fourth substrate 14. For example, copper foil is preferably applied to an LCP sheet, and this copper foil is patterned by photolithography. Furthermore, a hole is provided in the second substrate 12, and, for example, an Sn-based conductive paste is preferably printed and coated in the hole and is temporarily cured to provide a via conductor 43 which is not yet solidified.

Furthermore, a thermosetting resin film 35 is provided on a lower surface of the second substrate 12 (a surface opposite to a formation surface of the second conductor pattern 22). For example, an epoxy resin film is preferably printed and formed. The thermosetting resin film 35 faces the first conductor pattern 21 at a position to insulate and coat the surface of the first conductor pattern 21. The thermosetting resin film 35 is a film whose main component is a thermosetting resin which thermally cures at a temperature lower than a press temperature during formation of the laminated body. The thermosetting resin film 35 is preferably, for example, an epoxy adhesive. A thermal curing start temperature of the thermosetting resin film 35 is preferably, for example, about 120° C. or more. When the thermosetting resin film 35 is thermally cured, the thermosetting resin film 35 has lower fluidity at a high temperature than that of each of the substrates 11, 12, 13, and 14 (thermoplastic resin).

Subsequently, the substrates 11, 12, 13, and 14 are laminated, and heated and pressed at a predetermined temperature (e.g., about 300° C.) preferably within a range of about 180° C. or more and about 320° C. or less, for example. Thus, the multilayer board 7 illustrated in FIG. 9B is obtained.

According to the present preferred embodiment, even when the first substrate 11 and the second substrate 12 are softened at the press temperature, the thermosetting resin film 35 hardly softens. Consequently, the insulation property between the first conductor pattern 21 and the second conductor pattern 22 is maintained.

In the present preferred embodiment, a step of covering the surface of the first conductor pattern 21 with the thermosetting resin film 35 by forming the thermosetting resin film 35 and performing the heating and pressing as described above corresponds to an "insulation coating formation step".

Eighth Preferred Embodiment

An eighth preferred embodiment of the present invention will describe a multilayer board which includes insulation coatings other than an oxide film, and a manufacturing method thereof.

Figure 10A:
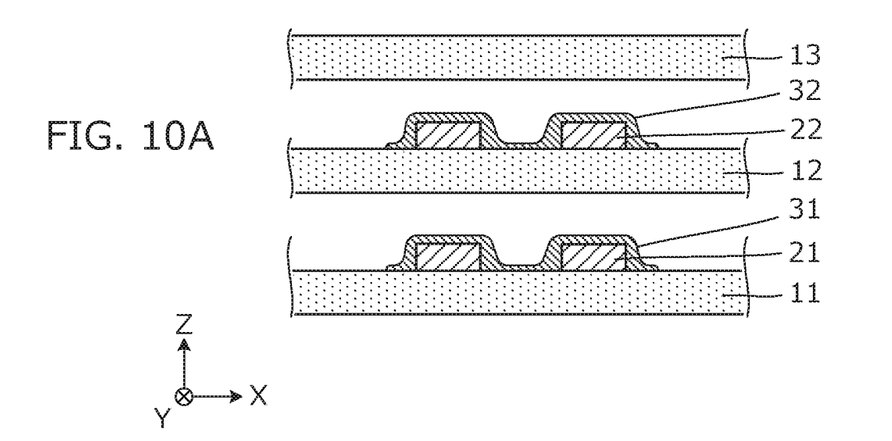
FIG. 10A is a cross-sectional view at a stage before a plurality of substrates of a multilayer board 8 according to an eighth preferred embodiment of the present invention are laminated and pressed.
Figure 10B:
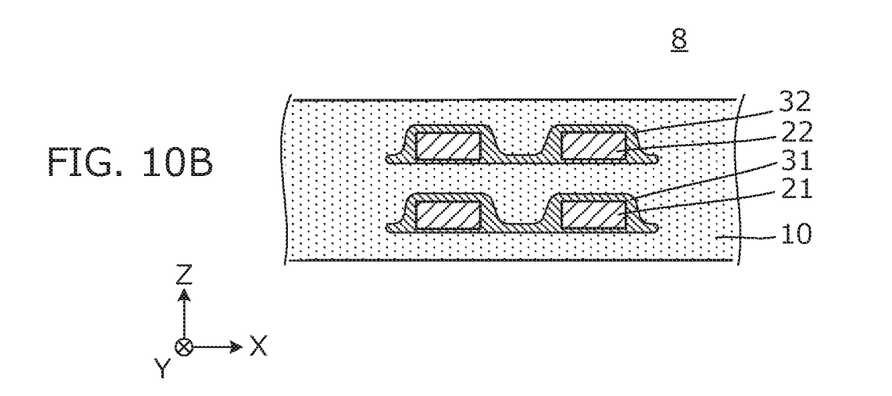
FIG. 10B is a cross-sectional view after lamination and pressing.

FIG. 10A is a cross-sectional view at a stage before a plurality of substrates of a multilayer board 8 according to the present preferred embodiment are laminated and pressed. FIG. 10B is a cross-sectional view after lamination and pressing.

First, as illustrated in FIG. 10A, a first conductor pattern 21 is provided on a first substrate 11 preferably made of, for example, a thermoplastic resin, and a second conductor pattern 22 is provided on a second substrate 12. For example, copper foil is preferably applied to an LCP sheet, and this copper foil is patterned by photolithography.

Next, a paste thermosetting resin is printed and coated on an upper surface of the first substrate 11 at a position to cover the first conductor pattern 21 to provide an insulation coating 31. Next, a paste thermosetting resin is printed and coated on an upper surface of the second substrate 12 at a position to cover the second conductor pattern 22 to provide an insulation coating 32. The insulation coatings 31 and 32 made of this thermosetting resin are films whose main component is the thermosetting resin which is thermally cured at a temperature lower than the press temperature during formation of the laminated body. The insulation coatings 31 and 32 are preferably, for example, epoxy adhesives.

Next, in a state of each of the substrates 11 and 12 (a state of a single body before lamination), the insulation coatings 31 and 32 made of the thermosetting resin are thermally cured at a temperature lower than the press temperature during formation of the laminated body. When a thermal curing start temperature of this thermosetting resin is, for example, about 120° C. or more, the insulation coatings 31 and 32 are heated at a temperature equal to or more than about 120° C. and less than the heating press temperature to be thermally cured. When the thermosetting resin is thermally cured, the thermosetting resin has lower fluidity at a high temperature than that of each of the substrates 11, 12, and 13 (thermoplastic resin).

Subsequently, each of the substrates 11, 12, and 13 are laminated, and heated and pressed at a predetermined temperature (e.g., about 300° C.) preferably within a range of about 180° C. or more and about 320° C. or less, for example. Thus, the multilayer board 7 illustrated in FIG. 10B is obtained.

According to the present preferred embodiment, even when the first substrate 11 and the second substrate 12 are softened at the press temperature, the insulation coatings 31 and 32 are hardly softened. Consequently, the insulation property between the first conductor pattern 21 and the second conductor pattern 22 is maintained.

Furthermore, in a state of the first substrate 11 before lamination, adjacent portions of the first conductor pattern 21 are connected via the insulation coating 31. Similarly, in a state of the second substrate 12 before lamination, adjacent portions of the second conductor pattern 22 are connected via the insulation coating 32. Thus, a position shift of the adjacent conductor patterns of each of the conductor patterns 21 and 22 caused by the flow of resin during heating and pressing is reduced or prevented.

The paste thermosetting resin is printed and coated, and, in addition, the thermosetting resin film may be applied to predetermined positions of the substrates 11 and 12 and then the thermosetting resin film may be thermally cured to achieve the state illustrated in FIG. 10A. This method is able to more easily form the insulation coatings having a reduced thickness and easily form the coatings as compared to a case in which the paste thermosetting resin is printed and coated.

Ninth Preferred Embodiment

A ninth preferred embodiment of the present invention will describe a non-limiting example of a manufacturing method of a multilayer board for forming insulation coatings made of a thermosetting resin by a method other than printing and coating.

Figure 11A:
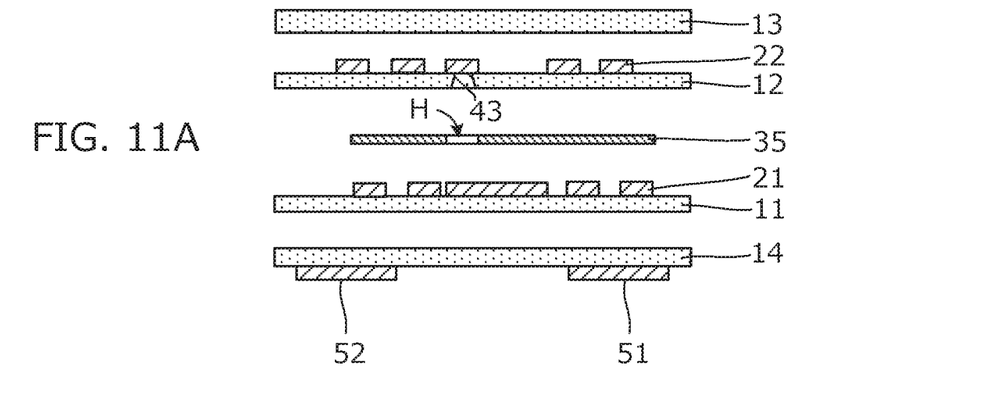
FIG. 11A is a cross-sectional view at a stage before a plurality of substrates of a multilayer board 9 according to a ninth preferred embodiment of the present invention are laminated and pressed.
Figure 11B:
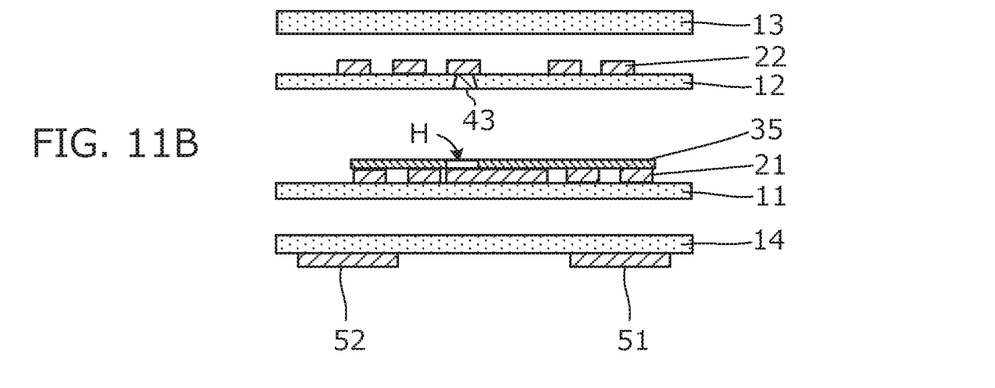
FIG. 11B is a cross-sectional view at an intermediate stage before lamination and pressing.
Figure 11C:
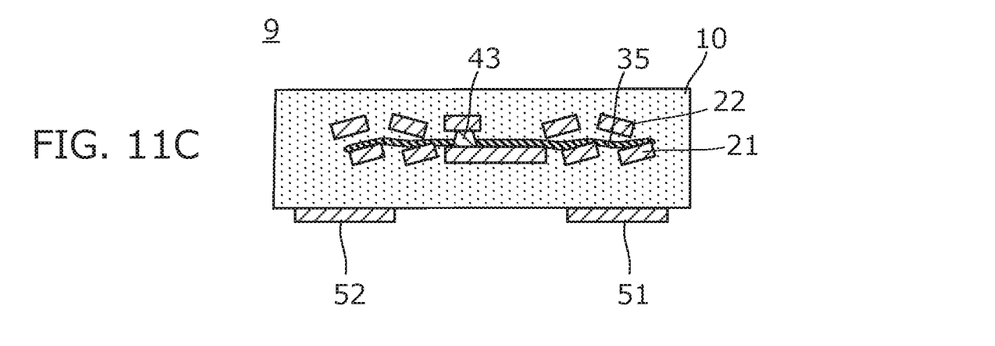
FIG. 11C is a cross-sectional view after lamination and pressing.

FIG. 11A is a cross-sectional view at a stage before a plurality of substrates of a multilayer board 9 according to the present preferred embodiment are laminated and pressed. FIG. 11B is a cross-sectional view at an intermediate stage before lamination and pressing. FIG. 11C is a cross-sectional view after lamination and pressing. These figures are the cross-sectional views of positions corresponding to those in FIGS. 8A and 8B described in the sixth preferred embodiment. The multilayer board 9 according to the present preferred embodiment is manufactured as follows.

As illustrated in FIG. 11A, a first conductor pattern 21 is formed on a first substrate 11 preferably made of, for example, a thermoplastic resin, a second conductor pattern 22 is formed on a second substrate 12, and terminal electrodes 51 and 52 are formed on a fourth substrate 14. Furthermore, a via conductor 43 which is not yet solidified is formed on the second substrate 12.

As illustrated in FIG. 11B, a thermosetting resin film 35 is applied to the surface of the first substrate 11 to cover the first conductor pattern 21. A hole H is formed in advance in the thermosetting resin film 35 at a position corresponding to the via conductor 43.

The thermosetting resin film 35 is a prepreg sheet whose main component is a thermosetting resin having a thermal curing start temperature lower than a press temperature. The thermosetting resin is preferably, for example, an epoxy resin. A film which has been cured in advance at a temperature equal to or more than the press temperature may be used for the thermosetting resin film 35.

Subsequently, heating and pressing provide the multilayer board 9 illustrated in FIG. 11C.

Each of the above-described preferred embodiments has described an example in which an opposite surface (back surface) to a formation surface of a second conductor pattern for a second substrate faces a formation surface (front surface) of a first conductor pattern for a first substrate. However, the opposite surface (back surface) to the formation surface of the second conductor pattern for the second substrate may face and be laminated on the opposite surface (back surface) to the formation surface of the first conductor pattern for the first substrate.

Each of the above-described preferred embodiments has described an example in which the first substrate and the second substrate are in contact. However, another substrate on which a conductor pattern close to the first conductor pattern is not provided may be sandwiched between the first substrate and the second substrate. For example, the formation surface of the first conductor pattern for the first substrate, and the formation surface of the second conductor pattern for the second substrate may be laminated while sandwiching a substrate on which a conductor pattern close to the first conductor pattern is not provided.

Each of the above-described preferred embodiments has described a multilayer board including a decreased number of laminated substrates. However, another preferred embodiment may have a structure in which the substrate, the insulation coating, and the substrate are repeatedly laminated in this order. For example, the total number of laminated substrates may be approximately 20, for example.

A polyimide resin other than the epoxy resin described above may also be used for the thermosetting resin used for the multilayer board according to a preferred embodiment of the present invention.

Each of the above-described preferred embodiments has described a single-unit component. However, a collective substrate including a plurality of element formation units may be subjected to processing in each step (manufactured by a large-size process) and then separated into individual pieces.

The example illustrated in FIG. 6 describes the coil device and the inductor. However, multilayer boards according to preferred embodiments of the present invention are applicable to various electronic devices and components such as antennas, actuators and sensors, for example. Furthermore, multilayer boards according to preferred embodiments of the present invention are not limited to an element of a chip shape, and includes elements of other optional shapes. Thus, preferred embodiments of the present invention may be optionally changed without departing from the gist of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer board comprising:
   a first substrate made of a thermoplastic resin;
   a first conductor pattern provided on an upper surface of the first substrate;
   a second substrate made of a thermoplastic resin;
   a second conductor pattern provided on an upper surface of the second substrate;
   a via conductor provided in the second substrate and providing an inter-layer connection between the first conductor pattern and the second conductor pattern; and
   an insulation coating made of a material having lower fluidity at a predetermined press temperature than fluidities of the first substrate and the second substrate, and at least partially disposed between the first substrate and the second substrate to cover the first conductor pattern; wherein
   the second substrate is in contact with the upper surface of the first substrate, and the first conductor pattern and the second conductor pattern are closest to each other in a lamination direction;
   the multilayer board further comprises a plurality of substrates including the first substrate and the second substrate that have been laminated and thermally compressed and bonded to each other at the predetermined press temperature; and
   by the thermal compression and bonding, the first conductor pattern and the second conductor pattern are connected to each other by the via conductor and not by the insulation coating.

2. The multilayer board according to claim 1, wherein the first conductor pattern and the second conductor pattern are located at positions shifted from each other in a plan view.

3. The multilayer board according to claim 1, wherein the first conductor pattern and the second conductor pattern partially overlap each other in a plan view.

4. The multilayer board according to claim 1, wherein the first conductor pattern and the second conductor pattern are patterns of copper foil.

5. The multilayer board according to claim 4, wherein the insulation coating is an oxide film provided on a surface of the copper foil.

6. The multilayer board according to claim 1, wherein the insulation coating is a thermosetting resin film that has been thermally cured at a temperature lower than the predetermined press temperature.

7. The multilayer board according to claim 1, wherein the first conductor pattern and the second conductor pattern are coil patterns including a winding axis extending in the lamination direction.

8. The multilayer board according to claim 1, wherein
   the first conductor pattern includes a first main surface facing the first substrate, a second main surface facing the second substrate, and an end surface; and
   the insulation coating covers the second main surface of the first conductor pattern.

9. The multilayer board according to claim 8, wherein the insulation coating does not cover the end surface of the first conductor pattern.

* * * * *